United States Patent [19]

Nelson

[11] 4,019,177

[45] Apr. 19, 1977

[54] MAGNETIC BUBBLE DETECTOR

[75] Inventor: Terence John Nelson, New Providence, N.J.

[73] Assignee: Bell Telephone Laboratories, Incorporated, Murray Hill, N.J.

[22] Filed: Mar. 10, 1976

[21] Appl. No.: 665,422

[52] U.S. Cl. .................. 340/174 TF; 340/174 EB
[51] Int. Cl.² ..................................... G11C 19/08
[58] Field of Search ........................... 340/174 TF

[56] References Cited

UNITED STATES PATENTS

| | | |
|---|---|---|
| 3,702,995 | 11/1972 | Bobeck et al. ............ 340/174 TF |
| 3,713,120 | 1/1973 | Bobeck et al. ............ 340/174 TF |
| 3,810,132 | 5/1974 | Bobeck .................... 340/174 TF |
| 3,820,092 | 6/1974 | Bobeck et al. ............ 340/174 TF |

*Primary Examiner*—James W. Moffitt
*Attorney, Agent, or Firm*—Herbert M. Shapiro

[57] ABSTRACT

A permalloy magnetic bubble detector employing a number of chevron elements in a detector stage of a bubble expansion detector is improved by the reduction in cross section of the legs of the chevron elements in strategic locations.

4 Claims, 5 Drawing Figures

4,019,177

MAGNETIC BUBBLE DETECTOR

BACKGROUND OF THE INVENTION

1. Field of the Invention

This invention relates to magnetic bubble memories and more particularly to magnetoresistive detectors for such bubbles.

2. Description of the Prior Art

Magnetic bubble memories are well known in the art. The most common detector for detecting magnetic bubbles in such a memory is an expansion detector of a type disclosed in A. H. Bobeck, F. J. Ciak and W. Strauss, U.S. Pat. No. 3,702,995, issued Nov. 14, 1972. That patent describes a detector which is defined by a column of chevron-shaped elements operative to expand a bubble along an axis lateral to that along which the bubble moves. Both bubble movement and expansion are due to a pattern of magnetic elements commonly composed of magnetically soft permalloy in response to a rotating in-plane magnetic field in a now-familiar manner.

That patent shows the chevron elements of a detector interlinked by permalloy connections between the apices of the elements and states that the interlinking elements can come at points other than the apices. Interlinking elements at alternate ends of successive elements leads to the longest magnetoresistive path and, supposedly, to the largest output signal corresponding to the passage of a bubble by the column of chevron elements in the detector stage.

By the same philosophy, the movement of one set of interlinking elements from one edge to the apices of the chevron elements shortens the magnetoresistive path and would be expected to produce a signal of limited amplitude and which would be relatively difficult and thus expensive to detect.

BRIEF DESCRIPTION OF THE INVENTION

The present invention is based on the realization that the output signal with interlinking elements at alternate ends of successive chevron elements consists of two similar subsignals separated by 180° in rotating field direction, and that the movement of one set of interlinking elements to the apices limits the amplitude of only one of these subsignals. But the resistance of the structure is reduced by 20 percent making electronic discrimination easier and therefore less expensive. Further, a decrease in the cross-sectional area of one of the legs of each chevron element at the point at which the bubble is detected leads to a localized magnetization of the element in a manner to improve the amplitude of the output signal. Because the permalloy pattern is formed with uniform thickness, the most convenient manner to achieve the reduced cross section is to reduce the width of the leg of each chevron element in the detector at the selected position.

DETAILED DESCRIPTION

Figure 1:
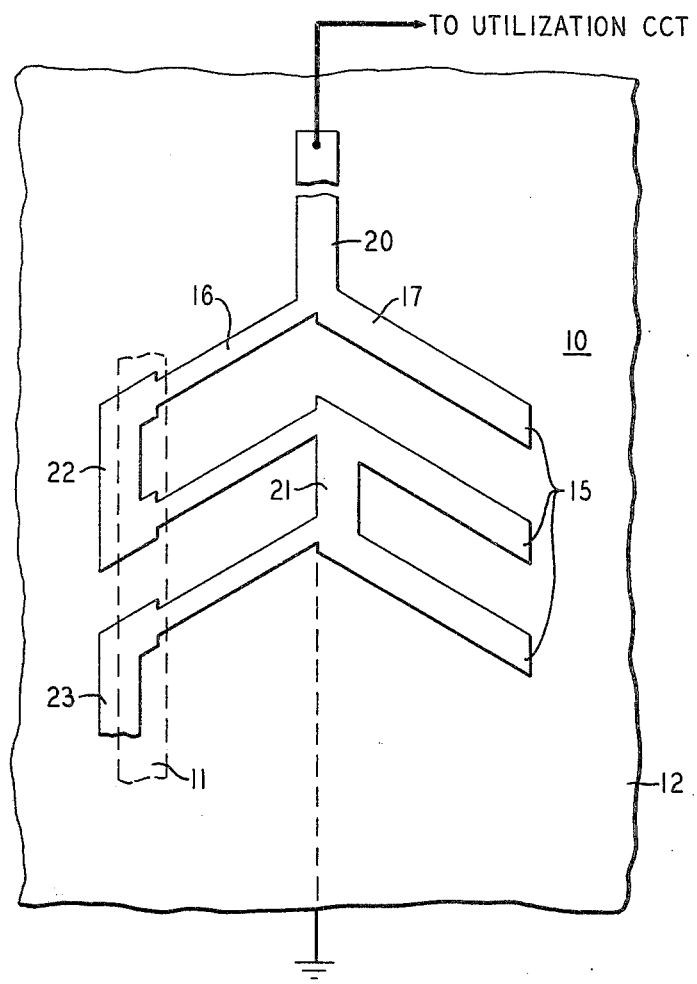
FIG. 1 is an expanded top view of a portion of a magnetoresistive bubble detector in accordance with this invention.

FIG. 1 shows a portion 10 of a magnetic bubble memory including a magnetoresistive detector employed for detecting a magnetic bubble 11 in a magnetic bubble memory (not shown). The bubble is assumed to be moving from left to right in a film 12 due to the action of an in-plane field $H_r$ of FIG. 2 on a pattern of permalloy elements also not shown. Field $H_r$ is rotating clockwise in film 12 as represented by the curved arrow in FIG. 2.

The detector includes a plurality of generally chevron-shaped elements 15 aligned in a column astride the path of bubble movement. Each element includes a leading and a trailing leg 16 and 17 defined with respect to the movement of bubble 11. That is to say, the leg first encountered by the bubble is the leading leg; the second, the trailing.

The various elements are connected by vertical interlinking elements to define a single magnetoresistive element primarily from the leading legs of the chevrons in the illustrative embodiment. For example, linking elements 20 and 21 interconnect trailing legs of chevron elements almost at the apices of the chevrons. Other interlinking elements, 22 and 23, interlink adjacent chevrons at the beginning of the leading legs. Thus, the trailing legs of the chevron elements are excluded from the magnetoresistive element in the illustrative embodiment.

The leading legs, on the other hand, define the signal exhibited by the detector. A comparison between the geometries of the leading and trailing legs of a chevron in FIG. 1 indicates that the width of the leading leg is narrowed. This is accomplished in a computer-controlled pattern generator, for example, by a change in the address, by one, to reduce the pattern width. For convenience, the width is shown reduced by one address from each edge of the leg of each chevron element. The effect is to provide greater magnetization of the leading legs of the chevrons at a time when the drive field $H_r$ is oriented to move a bubble into a position for detection.

Figure 2:
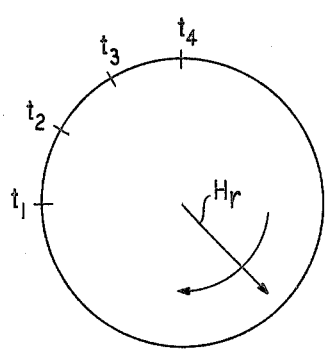
FIG. 2 is a diagram of the drive field orientation with respect to which the timing of FIGS. 3, 4, and 5 is established.

FIG. 2 establishes a time sequence $T_1$, $T_2$, $T_3$ and $T_4$ initiated when the drive field orients to the left as viewed in the figure. At time $T_1$, bubble 11 moves to the left ends of the leading legs of the chevron elements. At time $T_4$, the field is directed upward and the bubble moves to the position of the apices.

Figure 3:
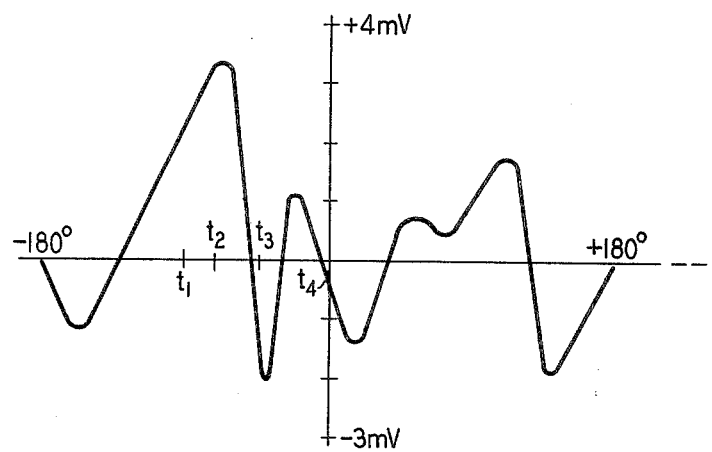
FIGS. 3, and 4, and FIG. 5 are graphs of the outputs of detectors of the type shown in FIG. 1 and a prior art output, respectively.

The output signal generated by the presence of the bubble at the detector is shown in FIG. 3. It is to be noted that the output signal starts prior to $T_1$, peaks at $T_2$ and $T_3$ and terminates at $T_4$. For detection, it is convenient to reference the positive peak and to compare the negative peak by familiar clamp and strobe techniques. To this end, the detector is conveniently connected in a bridge arrangement between a utilization circuit (not shown) and ground.

Figure 4:
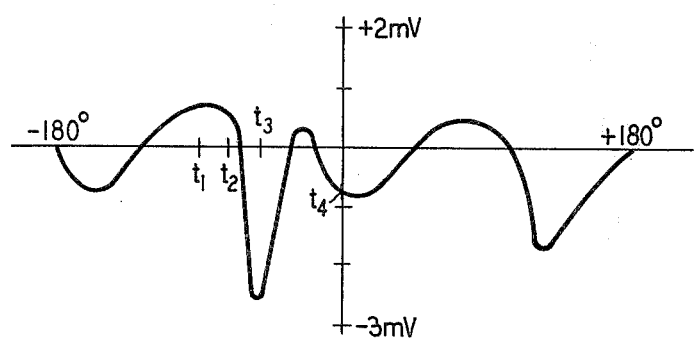

When compared to prior art outputs, the improvement due to asymmetric placement of interconnecting elements and reduction in width of the legs of the chevron elements of a magnetorestive detector are clear. FIG. 4 shows an output produced by a like detector without width (generally cross section) reduction. The output is shown with the same scale as FIG. 3. The positive peak can be seen to be much reduced while the negative peak is essentially unchanged. A width reduction of 0.5 micron to each edge of each leading leg in the detector for chevron elements on 6 micron centers and 19 microns long produces an output of 5.5 millivolts (peak to peak compared to 3.1 millivolts from a detector of the type shown in FIG. 4).

Figure 5:
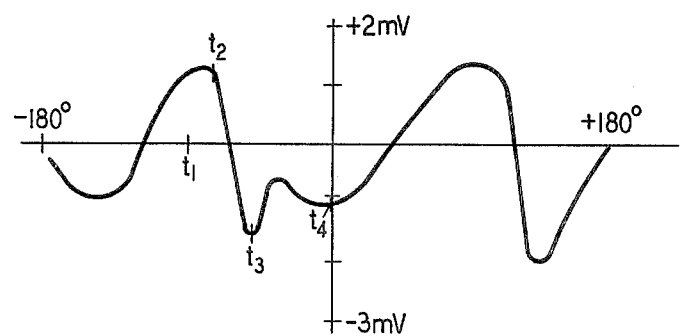

For further comparison, a prior art output obtained with asymmetrical arrangement of interconnecting elements and no width reduction is shown in FIG. 5. The negative peak is reduced by about 20 percent while the positive peak is intermediate to FIGS. 3 and 4. The peak-to-peak voltage change is essentially the same as in FIG. 4 although the dc resistance is higher. In fact the resistance is the same as that obtained with the width reduction in an asymmetrical structure. The prior art structure is thus characterized by a higher noise component without a correspondingly high output signal.

The further reduction in width of the legs of each of the chevrons can lead to improvements in output only until the leg is fully magnetized. And full magnetization depends on the strength of the drive field. It is desirable to reduce the drive field as much as possible to minimize energy consumption during operation. At some value of drive field, of course, the chevron element would be entirely magnetized. But it is desirable to employ a drive field of insufficient strength to magnetize the chevrons fully. For memories in which such relatively low drive fields are used, the chevrons typicaly are operating in a nonsaturated mode. Thus, the reduction in leg width is highly beneficial.

It is to be understood that a bubble is maintained at a nominal diameter by a familiar bias field supplied by a source (not shown) and elongates as shown in FIG. 1, because of the effect of the drive field on the chevron elements.

What has been described is considered merely illustrative of the principles of this invention. Therefore, various modifications of this invention can be devised by those skilled in the art in accordance with those principles within the spirit and scope of the invention as claimed hereinafter.

What is claimed is:

1. A magnetic bubble memory comprising a layer of material in which magnetic bubbles can be moved, a magnetoresistive detector and means for moving said bubbles to said detector, said detector comprising a plurality of chevron elements each having first and second legs, said elements being aligned along an axis transverse to the path of bubble movement, said chevron elements being interconnected by interlinking elements at an end and at about the apex of each into a single magnetoresistive element including said first leg therebetween, said first leg having a cross section reduced from that of said second leg.

2. A memory in accordance with claim 1 wherein said first leg has a width reduced from that of said second leg of each of said elements.

3. A memory in accordance with claim 2 wherein said elements are of permalloy.

4. A memory in accordance with claim 3 wherein said reduction in width is achieved by indenting said first leg equally at the two edges thereof.

* * * * *